United States Patent [19]

Chandross

[11] Patent Number: 4,774,188

[45] Date of Patent: Sep. 27, 1988

[54] CONTROL OF CIRCUIT BOARD QUALITY

[75] Inventor: Edwin A. Chandross, Berkeley Heights, N.J.

[73] Assignee: American Telephone and Telegraph Company, AT&T Bell Laboratories, Murray Hill, N.J.

[21] Appl. No.: 144,736

[22] Filed: Jan. 15, 1988

Related U.S. Application Data

[63] Continuation of Ser. No. 834,556, Feb. 28, 1986, abandoned, which is a continuation of Ser. No. 518,455, Jul. 29, 1983, abandoned.

[51] Int. Cl.⁴ .............. G01N 21/64; B32B 15/08; B32B 27/38
[52] U.S. Cl. ........................................ 436/5; 250/362; 250/459.1; 428/418; 428/901
[58] Field of Search ............... 250/459.1, 302, 362, 250/458; 436/5; 428/209, 418, 901, 606

[56] References Cited

U.S. PATENT DOCUMENTS

| | | | |
|---|---|---|---|
| 3,617,744 | 11/1971 | Irish | 250/71 |
| 4,016,133 | 4/1977 | Hyosu et al. | 534/719 |
| 4,152,723 | 5/1979 | McMahon et al. | 250/458.1 |
| 4,400,618 | 8/1983 | Bupp et al. | 250/302 |

*Primary Examiner*—Michael S. Marcus
*Attorney, Agent, or Firm*—Bruce S. Schneider

[57] ABSTRACT

Circuit boards with advantageous properties are produced through the addition of a fluorescent dye. The presence of the dye allows an expeditious inspection of the metallic pattern on the circuit board by induced fluorescence.

12 Claims, No Drawings

CONTROL OF CIRCUIT BOARD QUALITY

This application is a continuation of application Ser. No. 834,556, filed Feb. 28, 1986, abandoned, which is a continuation of application Ser. No. 518,455 filed July 29, 1983, abandoned.

BACKGROUND OF THE INVENTION

1. Field of the Invention

This invention relates to electronic equipment and, in particular, to printed circuit boards.

2. Art Background

Printed circuit boards are widely used in electronic equipment. In such boards generally a metallic, e.g., copper, pattern is produced on a polymer substrate. The substrates are typically fabricated by spraying a lacquer including the desired resin, for example, an epoxy resin, onto a reinforcing grid such as a fiber glass mesh. A variety of methods are employed to produce the copper pattern. These methods typically involve a lithographic process and a wet etching process which, although quite reliable, sometimes yield irregularities in the desired pattern. For example, discontinuities or width narrowing or broadening in metallic pattern lines are encountered. Such irregularities often lead to the degradation of component properties and ultimately to equipment failure.

It is desirable to detect irregularities before further processing occurs. After the metal pattern is produced, electronic components are affixed to the pattern through various expedients such as soldering. Obviously, if the pattern produces a failure after the components are affixed, a large expense is incurred in either replacing the board or, alternatively, in discovering the point of failure and repairing it. In contrast, if the irregularity is detected before affixing of the electronic components, the relatively inexpensive board is either discarded or expeditiously repaired.

Various ways have been investigated to determine the presence of pattern flaws before installation of circuit components. For example, as disclosed in U.S. Pat. No. 4,152,723, filed May 1, 1979, (which is hereby incorporated by reference) pattern flaws are detectable using a luminescence technique. In particular, a light source such as a laser is employed to induce a fluorescence in the polymer substrate. Only the portions of the substrate which are not covered by the metallic pattern are illuminated and thus fluoresce. The ambits of the metallic pattern are to an extent determined by sweeping a light beam across the patterned surface and monitoring with conventional equipment, such as a photomultiplier, the fluorescence intensity fluctuations during the sweep. However, this technique does not lead to the reliable observation of pattern flaws.

SUMMARY OF THE INVENTION

The reliable and expeditious detection of pattern flaws in printed circuit boards is achieved by utilizing a carefully chosen combination of resin and dye in conjunction with a specific process. In particular, the substrate of the printed circuit board is prepared with a spatially homogeneous distribution of a fluorescent dye having a ring system represented by the formulae

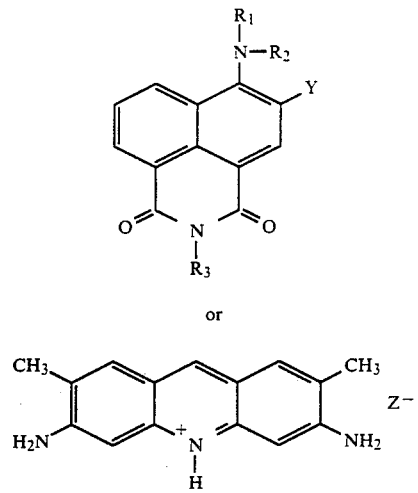

These resin compositions are easily excited using a He-Cd laser operating, for example, at 442 nm, and fluorescence is stimulated in a conveniently detected spectral region, e.g., 460 to 550 nm. Stimulation of emission and subsequent monitoring utilizing conventional techniques allow detection of pattern flaws as small as 50 $\mu$m.

DETAILED DESCRIPTION

Through the use of specific substrate compositions, advantageous and expeditious determination of flaws in printed circuit board patterns is possible. The dye employed in the substrate composition should fulfill certain criteria. The dye should not substantially alter the desired physical or electrical properties of the substrate. For example, it is possible that the use of a highly ionic dye will increase the conductivity of the substrate and thus substantially degrade the insulation resistance necessary to prevent electrical conductivity between disjoint sections of the metallic pattern. Similarly, a dye which degrades the physical integrity of the substrate, e.g., a dye which causes decomposition, or curing or premature aging of the substrate resin through reaction, is also undesirable and should be avoided. Dyes which migrate to the substrate surface and affect the bond to the patterned metal also should be avoided.

The dye should be essentially homogeneously dispersed in the substrate, i.e., the average fluorescence intensity of regions $10^4$ $(\mu m)^2$ in area should vary on average less than 10 percent over all patterned regions of the circuit board. Generally to satisfy this criterion, it is necessary to find a dye which easily disperses directly into the resin, or to find a dye which is cosoluble in the vehicle, e.g., lacquer, employed to produce the circuit board substrate.

The dye should also satisfy certain optical criteria. The fluorescence induced should preferably have a substantial fraction of its intensity below a wavelength of 520 nm. Typically, if fluorescence occurs at higher wavelengths, detection of the fluorescence by using conventional expedients is significantly more difficult. Substantial fluorescence below 460 nm, although acceptable, is generally not produced. For single photon processes, the induced fluorescence occurs at wavelengths which are longer than that of the exciting light. Convenient light sources, such as the He-Cd laser, typically emit at wavelengths above 420 nm. It is preferred to employ a laser since it is easily possible to focus the source to a spot size which is smaller than the smallest metal pattern dimension while preserving intensity. Thus, fluorescence below 420 nm for a convenient light source is generally not presently available.

The observable fluorescence intensity produced by the dye should be at least 10 times greater than the level of fluorescence produced in the substrate in the absence of the dye. Light absorbed farther than 1 mm from the illuminated surface results in fluorescence which is substantially dispersed within the substrate and thus is not readily detected. A dye concentration within 1 mm of the substrate surface of 0.5 to 0.005 percent by weight generally produces the desired absorption and, for typical light sources such as He-Cd laser, yields adequate fluorescence. A control sample is employed to determine the precise dye concentration suitable for a desired absorption level. However, a dye concentration of greater than 1 percent typically produces a dark colored substrate and thus should be avoided.

The dye also should not migrate in the substrate. Such migration leads to inhomogeneities and the previously discussed adverse consequences.

All the previous criteria involved in the subject invention are satisfied by utilizing a dye having a structure based on

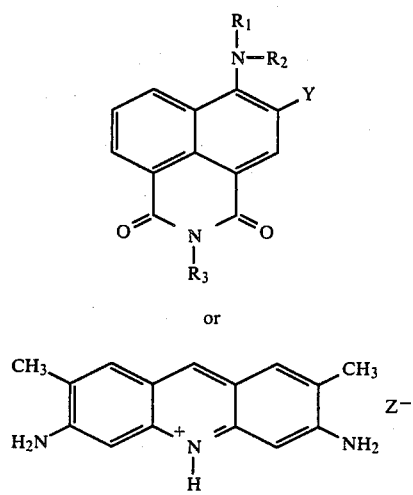

where Y is $SO_3G$ (G being an alkali metal cation) or H, $R_1$ and $R_2$ are individually hydrogen, methyl or ethyl, $R_3$ is a group such as H, a lower alkyl (preferably less than 5 carbon atoms), p-tolyl, or xylyl, where $Z^-$ is $Cl^-$, $Br^-$, $I^-$, $NO_3^-$, or p-toluenesulfonate. Compound (2) is homogeneously dispersible in resins such as epoxy resins, e.g., bisphenol-A diglycidyl ether resins, by the simple expedient of dissolving and/or dispersing the dye in the resin lacquer.

The dyes of composition (1) are also dissolvable and/or dispersible as discussed for the composition (2) dyes. Alternatively, the composition (1) dyes are sufficiently soluble in typical lacquer vehicles such as N,N-dimethylformamide or N-methylpyrrolidone. Therefore, it is possible to form a solution including both the resin and the dye as a lacquer. Similarly, for the composition (1) dye it is preferable to improve the solubility by modifying the parent chromophore (Y, $R_1$, $R_2$, and $R_3$ all being H) by reacting it initially with an excess of bisphenol-A diglycidyl ether. (For example, at least two moles of the bisphenol-A diglycidyl ether are employed for every mole in the dye composition.) This reaction yields a much more soluble dye composition having reactive epoxy groups. The dye solution is then combined with the resin in lacquer form. The lacquer is then applied by conventional techniques to a glass mesh to produce a glass fiber reinforced polymer substrate. Since the dye is modified to contain epoxy groups, it reacts as the resin cures and thus is chemically bound within the resin without substantially changing the mechanical or electrical properties of the resin and without changing the fluorescence properties of the dye. Thus, a homogeneous distribution which has long-term stability is advantageously produced. Although this reaction procedure is described in terms of an epoxy resin, it is similarly possible to modify the dye to have reactive groups consistent with the use of other substrate resins.

Often a curing agent is employed to harden the resin, for example, in the case of epoxy resins, curing agents such as dicyandiamide are employed. Substantial destruction of this curing agent before initiation of curing is disadvantageous. The composition (1) and (2) dyes do not substantially react with typical curing agents at nominal temperatures and thus do not significantly decrease their efficacy. Additionally, these dyes do not cause premature hardening of the resin.

EXAMPLE 1

Printed circuit boards meeting the FR-4 specification of the National Electrical Manufacturer's Association were prepared as described by A. N. Cianciarulo and R. L. Webb in *Proceedings of the 23rd Annual Technical Conference,* Reinforced Plastics/Composites Division, the Society of the Plastic Industry, Incorporated, 1968, Section 5B, pp. 1-6. This procedure, however, was modified by introducing a dye into the resin or into the resin solvent. Three dyes were individually employed in the manufacture of circuit boards. The first and second dyes, Acridine Yellow G (the compound previously denominated (2) with Z=Cl) and Brilliant Sulphaflavine (the compound previously denominated (1) with $R_1=R_2=H$, $R_3=$p-tolyl, and $Y=SO_3Na$), respectively, were dispersed directly in the solvent and were utilized in the fabrication procedure.

A third dye was incorporated into the resin. The dye was prepared by adding 4-amino-1,8-naphthalimide (0.24 mole, 50.4 g) and bisphenol-A diglycidyl ether (0.48 mole, 163.2 g) to 1-methyl-2-pyrrolidinone (287 g). The mixture was heated at 155 degrees C. under nitrogen while being agitated utilizing a mechanical stirrer. This heating and agitation was continued for approximately 6 hours to ensure that the solids had dissolved and then heated and agitated for an additional 2 hours. The solution was then cooled and filtered through Celite ® (a filter aid, manufactured by Johns Manville Corporation primarily finely divided $SiO_2$) to yield a solution of concentration 10.1 percent by weight based on the aminonaphthalimide chromophore. The dye solution was then added to a resin solution in dimethylformanide to yield a 0.01 percent by weight concentration of the dye (expressed as the parent chromophore) in the resin.

EXAMPLE 2

The circuit boards of Example 1 were inspected using a 5 mW He-Cd laser focused to a $\leq 20$ μm spot size. The fluorescence induced by this laser was detected utilizing a photomultiplier. A cut-off filter placed before the photomultiplier was utilized to remove the dominate wavelengths of the laser. The luminescence intensity observed upon scanning the laser across the board was compared to the pattern expected for a perfectly formed circuit board. Defects as small as 50 μm were observed.

What is claimed is:

1. A patterned substrate comprising a metal pattern overlying a substrate wherein said substrate comprises a cured epoxy and includes a dye capable of fluorescing, wherein said dye is distributed in regions of said substrate underlying said metal pattern and wherein said dye has a chemical structure represented by a member chosen from the group consisting of (1)

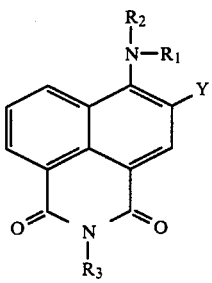

and (2)

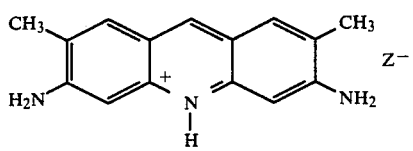

where Y is $SO_3G$, (G is an alkali metal cation), or H, $R_1$ and $R_2$ are individually hydrogen, methyl, or ethyl, and $R_3$ is a lower alkyl, p-tolyl, xylyl, or hydrogen, and $Z^-$ is $Cl^-$, $Br^-$, $I^-$, $NO_3^-$ or p-toluenesulfonate.

2. The patterned substrate of claim 1 wherein said dye is chemically bonded to said substrate.

3. The patterned substrate of claim 1 wherein said substrate is an electronic circuit board.

4. The patterned substrate of claim 1 wherein said dye is distributed essentially homogeneously in said substrate.

5. The patterned substrate of claim 1 wherein said pattern comprises a patterned copper layer.

6. The patterned substrate of claim 1 wherein said dye is distributed essentially homogeneously in said substrate.

7. The patterned substrate of claim 6 wherein said pattern comprises a patterned copper plating.

8. A process for detecting flaws in a metal pattern which is formed on a substrate comprising the step of illuminating said substrate with a source of electromagnetic radiation and detecting the resulting fluorescence from said substrate Characterized in that said substrate comprises a cured epoxy and includes a dye capable of fluorescing, wherein, said dye is distributed in regions of said substrate underlying said metal pattern and wherein said dye comprises a material having a chemical structure represented by a member chosen from the group consisting of (1)

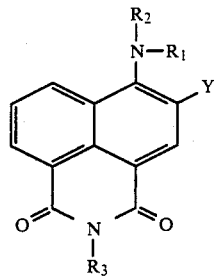

and (2)

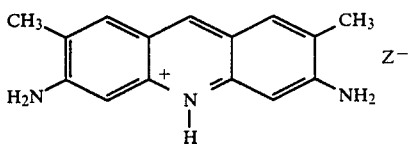

where Y is $SO_3G$ (G is an alkali metal cation) or hydrogen, $R_1$ and $R_2$ are individually hydrogen, methyl, or ethyl, and $R_3$ is a lower alkyl, p-tolyl, xylyl, or hydrogen and $Z^-$ is $Cl^-$, $Cr^-$, $I^-$, $NO_3^-$ or P-toluenesulfonate.

9. The process of claim 8 wherein said dye is chemically bonded to said substrate.

10. The process of claim 8 wherein said substrate is an electronic circuit board.

11. The process of claim 8 wherein said dye has been modified with a functional group that makes said dye more soluble in the material employed to form said substrate.

12. The process of claim 11 wherein said dye comprises

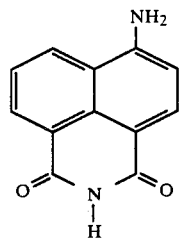

that has been modified to contain an epoxy functional group.

* * * * *